United States Patent
Nagatomo

(10) Patent No.: US 10,838,442 B2
(45) Date of Patent: Nov. 17, 2020

(54) SEMICONDUCTOR DEVICE AND POWER SOURCE SUPPLY METHOD

(71) Applicant: LAPIS SEMICONDUCTOR CO., LTD., Kanagawa (JP)

(72) Inventor: Shigeru Nagatomo, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/653,599

(22) Filed: Jul. 19, 2017

(65) Prior Publication Data
US 2017/0315571 A1 Nov. 2, 2017

Related U.S. Application Data

(63) Continuation of application No. 15/082,454, filed on Mar. 28, 2016, now Pat. No. 9,740,219.

(30) Foreign Application Priority Data

Mar. 31, 2015 (JP) .................................. 2015-071463

(51) Int. Cl.
*G05F 1/10* (2006.01)
*H03K 17/22* (2006.01)
(Continued)

(52) U.S. Cl.
CPC .................. *G05F 1/10* (2013.01); *G05F 1/46* (2013.01); *H03K 17/102* (2013.01); *H03K 17/22* (2013.01); *H03K 17/223* (2013.01)

(58) Field of Classification Search
CPC ... G05F 1/10; G05F 1/46; G05F 1/563; G05F 1/61; G05F 1/613–618; H03K 17/223; H03K 17/102; H03K 17/22
See application file for complete search history.

(56) References Cited

U.S. PATENT DOCUMENTS 4,553,196 A * 11/1985 Tokuyama ............... G05F 1/563
363/21.04
4,661,758 A * 4/1987 Whittaker ................. H02J 7/35
136/293

(Continued)

FOREIGN PATENT DOCUMENTS

JP S5616232 U 2/1981
JP 11-045947 A 2/1999
(Continued)

OTHER PUBLICATIONS

Japanese Office Action dated Aug. 28, 2018 with English translation, 7 pgs.

*Primary Examiner* — Thomas J. Hiltunen
(74) *Attorney, Agent, or Firm* — Volentine, Whitt & Francos, PLLC

(57) ABSTRACT

A semiconductor device including an input terminal to which a power source, for which the time until a voltage equal or greater than a predetermined voltage value is output fluctuates according to an external environment, is connected, a power source section to which the input terminal supplies power from the power source, a power source supply terminal that supplies power to a driven semiconductor device, a switch that controls a connection between the power source section and the power source supply terminal, and a voltage regulator to which the input terminal supplies power from the power source, and that supplies a voltage to the power source supply terminal is provided.

8 Claims, 4 Drawing Sheets

(51) Int. Cl.
    *G05F 1/46*     (2006.01)
    *H03K 17/10*    (2006.01)

(56) References Cited

U.S. PATENT DOCUMENTS

| | | | | |
|---|---|---|---|---|
| 4,843,224 A * | 6/1989 | Ohta | G06K 7/0008 | 235/487 |
| 4,914,469 A * | 4/1990 | Ishimura | G03B 7/26 | 323/318 |
| 5,306,961 A * | 4/1994 | Leo | G06F 3/0383 | 307/66 |
| 5,696,465 A | 12/1997 | Ishizuka | | |
| 5,747,974 A * | 5/1998 | Jeon | G05F 1/465 | 323/269 |
| 5,793,184 A * | 8/1998 | O'Connor | H02J 7/355 | 136/251 |
| 5,898,235 A * | 4/1999 | McClure | G11C 5/147 | 307/64 |
| 6,111,395 A * | 8/2000 | Hirade | G05F 1/465 | 323/273 |
| 6,191,499 B1 * | 2/2001 | Severson | G06F 1/26 | 307/31 |
| 6,288,523 B2 * | 9/2001 | Antoszkiewicz | G05F 1/577 | 323/267 |
| 6,313,693 B1 * | 11/2001 | Kelm | G05F 1/569 | 307/19 |
| 6,642,632 B2 * | 11/2003 | Lucas | G06F 1/263 | 307/23 |
| 6,667,603 B2 | 12/2003 | Hiraki et al. | | |
| 6,795,366 B2 | 9/2004 | Lee | | |
| 6,867,639 B2 * | 3/2005 | Chun | G11C 5/147 | 327/538 |
| 7,072,238 B2 * | 7/2006 | Chae | G11C 5/145 | 365/185.21 |
| 7,184,314 B2 * | 2/2007 | Hosono | G11C 16/32 | 365/148 |
| 7,200,066 B2 | 4/2007 | Krenzke et al. | | |
| 7,240,145 B2 * | 7/2007 | Holman | G06F 13/1689 | 711/104 |
| 7,271,504 B2 | 9/2007 | Wada | | |
| 7,400,060 B2 * | 7/2008 | Ueno | H02J 7/0065 | 307/10.1 |
| 7,471,061 B2 * | 12/2008 | Shah | H02J 9/061 | 307/66 |
| 7,498,855 B2 | 3/2009 | Kitajima | | |
| 7,956,587 B2 | 7/2011 | Kawase et al. | | |
| 8,009,404 B2 * | 8/2011 | Blinder | H02J 1/108 | 307/64 |
| 8,319,470 B2 * | 11/2012 | English | H02J 7/0073 | 136/244 |
| 8,629,647 B2 * | 1/2014 | Bhat | H02J 7/0029 | 320/101 |
| 8,638,161 B2 | 1/2014 | Robertson et al. | | |
| 8,806,229 B1 * | 8/2014 | Wright | G06F 1/26 | 327/365 |
| 9,280,925 B2 | 3/2016 | Luo et al. | | |
| 9,310,794 B2 * | 4/2016 | Arunachalam | G05B 19/0423 | |
| 9,397,653 B2 | 7/2016 | Suzuki | | |
| 9,502,924 B2 * | 11/2016 | Eggert | H02J 7/345 | |
| 9,561,727 B2 * | 2/2017 | Sawada | H02J 7/0055 | |
| 9,740,219 B2 * | 8/2017 | Nagatomo | H03K 17/102 | |
| 9,871,403 B2 | 1/2018 | Sotani et al. | | |
| 10,198,014 B2 * | 2/2019 | Tyagi | G05F 1/613 | |
| 2003/0034823 A1 * | 2/2003 | Hiraki | G06F 1/26 | 327/334 |
| 2003/0197551 A1 * | 10/2003 | Hamamoto | G05F 1/465 | 327/540 |
| 2004/0196096 A1 * | 10/2004 | Kondo | G05F 1/56 | 327/540 |
| 2007/0139100 A1 * | 6/2007 | Pan | G05F 1/575 | 327/540 |
| 2007/0174698 A1 * | 7/2007 | Bailey | G06F 1/28 | 714/22 |
| 2009/0079385 A1 * | 3/2009 | Xiao | H02M 3/1584 | 320/102 |
| 2009/0102449 A1 * | 4/2009 | Chang | H02M 3/1582 | 323/311 |
| 2011/0012552 A1 * | 1/2011 | Margalit | H02J 7/35 | 320/101 |
| 2013/0106369 A1 * | 5/2013 | Arunachalam | G05B 19/0423 | 323/234 |
| 2013/0321071 A1 | 12/2013 | Pietri et al. | | |
| 2014/0306675 A1 * | 10/2014 | Kohama | G05F 1/56 | 323/273 |
| 2016/0041932 A1 * | 2/2016 | Hokari | G06F 13/28 | 710/308 |
| 2016/0049813 A1 * | 2/2016 | Takizawa | H01M 10/441 | 320/112 |
| 2016/0156347 A1 | 6/2016 | Usuda | | |
| 2016/0246320 A1 * | 8/2016 | Chang | G05F 1/67 | |

FOREIGN PATENT DOCUMENTS

| | | |
|---|---|---|
| JP | 2003-143000 A | 5/2003 |
| JP | 2015023789 A1 | 2/2015 |
| WO | 2014203490 A1 | 12/2014 |

* cited by examiner

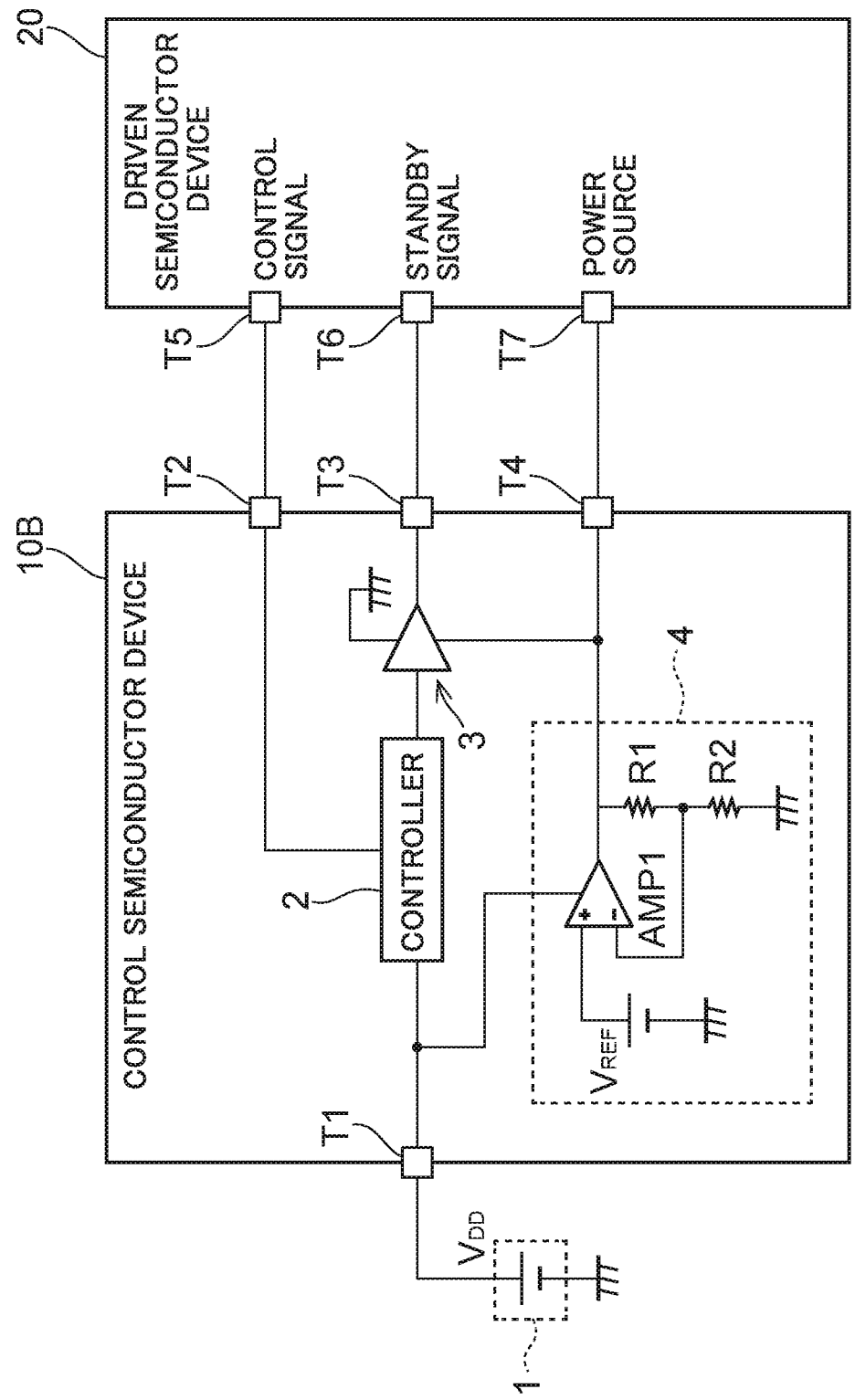

SEMICONDUCTOR DEVICE AND POWER SOURCE SUPPLY METHOD

CROSS-REFERENCE TO RELATED APPLICATION

This application is a continuation application of application Ser. No. 15/082,454, filed on Mar. 28, 2016, now U.S. Pat. No. 9,740,219, issued on Aug. 22, 2017, which claims priority claims priority under 35 USC 119 from Japanese Patent Application No. 2015-071463 filed on Mar. 31, 2015, the disclosure of which is incorporated by reference herein.

BACKGROUND OF THE INVENTION

Field of the Invention

The present invention relates to a semiconductor device and a power source supply method.

Description of the Related Art

Ordinarily, drive voltage for semiconductor devices is not communalized, and an appropriate driving voltage is specified for each semiconductor device. Accordingly, when, for example, a product that combines plural semiconductor devices is designed, each semiconductor device needs to be supplied with the drive voltage specified therefor.

For example, a method is known in which, when the drive voltage of a control semiconductor device that controls a driven semiconductor device that is one semiconductor device, is higher than the drive voltage of a driven semiconductor device that is another semiconductor device, a power source is connected to the control semiconductor device, a voltage of an input power source is lowered to the drive voltage of the driven semiconductor devices by a regulator installed in the control semiconductor device, and supplied to the driven semiconductor devices (for example, see Japanese Patent Application Laid-Open (JP-A) No. 2003-143000 (Patent Document 1) and JP-A No. H11-45947 (Patent Document 2)).

However, it is assumed that, for example, a stabilized power source known as a switching power source is employed as the power source supplied to the semiconductor device in Patent Document 1 and Patent Document 2.

However, development of, for example, solar panels that use sunlight to generate electricity is advancing with the increased usage of renewable energy in recent years, and solar panels having high power generation efficiency can be obtained at a lower cost than hitherto. Although this makes it conceivable to employ solar panels as power sources supplied to semiconductor devices, time is needed for an output voltage of the solar panel to reach the drive voltage of the semiconductor device when employed in a dark situation in which the environment of the solar panel is below a specified brightness due to the weather, the time of day, or the like. Accordingly, until the output voltage of the solar panel reaches the drive voltage of the semiconductor device (during a drive transition time), the only current supplied to the semiconductor device is lower than a current corresponding to the drive voltage of the semiconductor device.

Accordingly, startup control from the control semiconductor device to the driven semiconductor device is unstable during the drive transition time due to overcharging when attempting to start up the driven semiconductor device from the control semiconductor device, which has a different drive voltage from the driven device.

In order to stably execute startup control from the control semiconductor device to the driven semiconductor device during the drive transition time, a circuit, for executing startup control of the driven semiconductor device even when the current is lower than the current corresponding to the drive voltage, needs to be added to the control semiconductor device. It is therefore anticipated that simply replacing the power source supplied to the semiconductor devices of Patent Document 1 and Patent Document 2 with a solar panel will make the operation of the semiconductor device unstable during the drive transition time.

Moreover, circuits that execute startup control of a driven semiconductor device during the drive transition time are generally complicated, and adding such a circuit to a control semiconductor device increases the cost of the control semiconductor device, and makes the size of the control semiconductor device even greater than before addition of the circuit.

SUMMARY OF INVENTION

The present invention is proposed to solve the above issues, and an object of the present invention is to provide a semiconductor device and a power source supply method that enable driven semiconductor devices having different drive voltages to be started up without providing a complex circuit configuration, even when using a voltage supplied from a power source for which the time until a voltage equal or greater than a predetermined voltage value is output fluctuates according to the external environment.

A semiconductor device according to an aspect of the present invention includes: an input terminal to which a power source, for which the time until a voltage equal or greater than a predetermined voltage value is output fluctuates according to an external environment, is connected; a power source section to which the input terminal supplies power from the power source; a power source supply terminal that supplies power to a driven semiconductor device; a switch that controls a connection between the power source section and the power source supply terminal; and a voltage regulator to which the input terminal supplies power from the power source, and that supplies a voltage to the power source supply terminal.

A method, according to an aspect of the present invention, of supplying power to a power source supply terminal of a semiconductor device that includes: an input terminal to which a power source, for which the time until a voltage equal or greater than a predetermined voltage value is output fluctuates according to the external environment, is connected; a power source section to which the input terminal supplies power from the power source; a power source supply terminal that supplies power to a driven semiconductor device; a switch that controls a connection between the power source section and the power source supply terminal; and a voltage regulator to which the input terminal supplies power from the power source, the method including: switching the switch OFF and supplying a voltage from the voltage regulator to the power source supply terminal when a voltage of the power supplied to the input terminal of the semiconductor device is below a predetermined threshold value.

The present invention exhibits the advantageous effect of enabling driven semiconductor devices having different drive voltages to be started up without providing a complex circuit configuration.

BRIEF DESCRIPTION OF DRAWINGS

FIG. 5 is a circuit diagram illustrating an example of a case in which a conventional control semiconductor device has a different drive voltage from that of a driven semiconductor device.

DETAILED DESCRIPTION OF THE INVENTION

Figure 1:
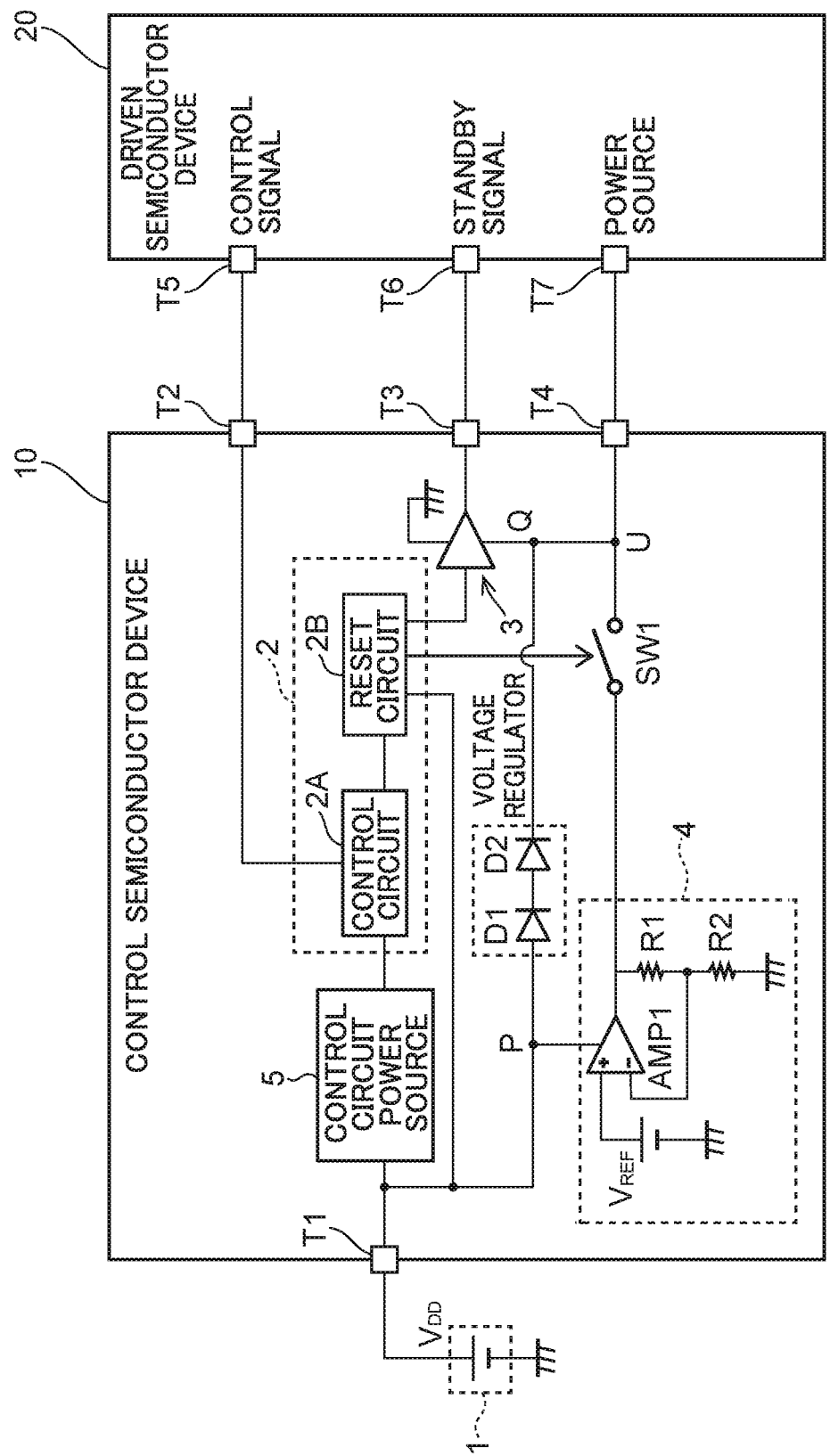
FIG. 1 is a circuit diagram illustrating an example of a case in which a control semiconductor device has a different drive voltage from that of a driven semiconductor device.

Detailed explanation follows regarding an example of an exemplary embodiment of technology disclosed herein, with reference to the drawings. Note that the same reference numerals are given to configuration elements having functions responsible for the same task, and duplicate explanation thereof is sometimes omitted as appropriate.

Figure 4:
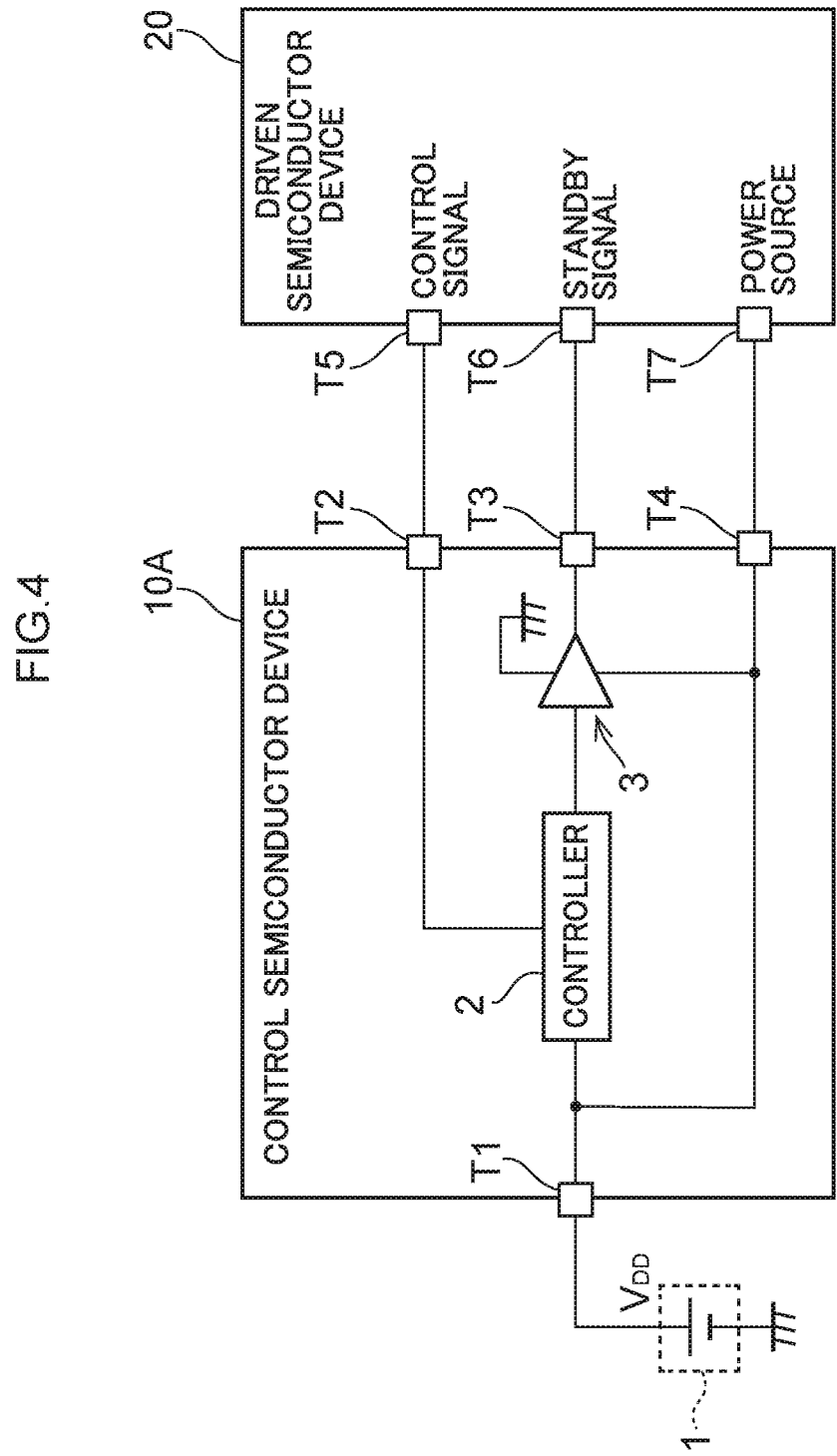
FIG. 4 is a circuit diagram illustrating an example of a case in which a control semiconductor device has the same drive voltage as that of a driven semiconductor device.

First, FIG. 4 illustrates an example of a circuit diagram in a case in which a driven semiconductor device is driven by a control semiconductor device having a drive voltage equal to that of the driven semiconductor device.

The circuit diagram illustrated in FIG. 4 includes, for example, a power source 1, a control semiconductor device 10A, and a driven semiconductor device 20. The control semiconductor device 10A includes terminals T1, T2, T3, and T4, and the driven semiconductor device 20 includes terminals T5, T6, and T7. The power source 1 is electrically connected to the terminal T1, the terminal T2 is electrically connected to the terminal T5, the terminal T3 is electrically connected to the terminal T6, and the terminal T4 is electrically connected to the terminal T7.

The power source 1 is a power source, for example a power source employed in a solar panel (a solar power source), for which the time until a voltage equal to a predetermined voltage value (an operation-enabling voltage $V_B$), needed in order to drive the control semiconductor device 10A and the driven semiconductor device 20, or above is output fluctuates according to the external environment, such as according to the weather, the time of day, and the location of installation. Note that the power source 1 is not limited to a solar power source, and may be any power source for which the time until a voltage equal to the operation-enabling voltage $V_B$ or greater is output fluctuates according to the external environment. For example, the power source 1 may be a power source that uses wind power to supply a voltage.

The power source 1 connected to the terminal T1 is supplied to each functional section included in the control semiconductor device 10A, namely, a controller 2 and an output section 3, from the terminal T4 that is electrically connected to the terminal T1, and is also supplied to the driven semiconductor device 20 through the terminal T7. The control semiconductor device 10A and the driven semiconductor device 20 are thereby driven.

However, the brightness of the surroundings of the power source 1 is sometimes lower than the brightness needed in order to supply the operation-enabling voltage $V_B$ from the power source 1, due to, for example, variation in weather.

When the control semiconductor device 10A and the driven semiconductor device 20 start up in such a state, an overcharge state is sometimes adopted in which current sufficient to drive the control semiconductor device 10A and the driven semiconductor device 20 cannot be acquired from the power source 1, and the control semiconductor device 10A and the driven semiconductor device 20 cannot be started up normally.

Accordingly, starting up in a standby state that serves as a preparation stage for temporarily starting up the control semiconductor device 10A and the driven semiconductor device 20, and then disengaging the standby state and driving the control semiconductor device 10A and the driven semiconductor device 20 when a voltage equal to the operation-enabling voltage $V_B$ or greater has been supplied from the power source 1, is a conceivable method of starting up the control semiconductor device 10A and the driven semiconductor device 20 in a state in which the only voltage supplied from the power source 1 is less than the operation-enabling voltage $V_B$.

In the standby state, out of the components included in the control semiconductor device 10A and the driven semiconductor device 20, the power source is supplied to only the components that are needed for causing a transition to a state in which operation is enabled for all of the functions included in the control semiconductor device 10A and the driven semiconductor device 20, namely, the operation-enabled state.

Accordingly, when the control semiconductor device 10A and the driven semiconductor device 20 start up in the standby state, power consumption is suppressed lower than when the control semiconductor device 10A and the driven semiconductor device 20 start up in the operation-enabled state. Therefore, even in a state in which the only voltage supplied from the power source 1 is below the operation-enabling voltage $V_B$, the control semiconductor device 10A and the driven semiconductor device 20 can start up normally in the standby state without an overcharge being generated in the control semiconductor device 10A or the driven semiconductor device 20.

The controller 2 thus outputs a standby signal to the output section 3 when the voltage of the power source supplied from the power source 1 is less than the operation-enabling voltage $V_B$, in order to start up the control semiconductor device 10A and the driven semiconductor device 20 in the standby state. When the standby signal is input from the controller 2, the output section 3 outputs the standby signal, which includes a voltage value supplied to the output section 3 from the power source 1, from the terminal T3 to the driven semiconductor device 20 through the terminal T6, and the driven semiconductor device 20 adopts the standby state. The controller 2 also places the control semiconductor device 10A in the standby state by outputting the generated standby signal to the controller 2 itself.

Then, when the voltage supplied from the power source 1 has become the operation-enabling voltage $V_B$ or above, the controller 2 suspends output of the standby signal, and the standby state of the control semiconductor device 10A and the driven semiconductor device 20 is disengaged. Obviously, the control semiconductor device 10A and the driven semiconductor device 20 can start up together normally at this time since the voltage supplied to the control semiconductor device 10A and the driven semiconductor device 20 from the power source 1 is the operation-enabling voltage $V_B$ or above. Thereafter, the controller 2 outputs a control signal, from the terminal T2 connected to the controller 2, to the terminal T5 of the driven semiconductor device 20, and controls the driven semiconductor device 20 so as to execute a target operation.

Next, FIG. 5 illustrates an example of a circuit diagram in a case in which the driven semiconductor device 20 is driven by a control semiconductor device 10B that has a drive voltage that is a voltage different from that of the driven semiconductor device 20.

In such cases, the voltage of the power source supplied from the power source 1 to the control semiconductor device 10B is set to a voltage that matches the drive voltage of the control semiconductor device 10B. Accordingly, for example, when the drive voltage of the driven semiconductor device 20 is lower than the drive voltage of the control semiconductor device 10B, a voltage exceeding the drive voltage of the driven semiconductor device 20 would be supplied to the driven semiconductor device 20 if the voltage of the power source 1 supplied to the terminal T1 were directly output from the terminal T4, as illustrated in FIG. 4.

A regulator 4 that lowers the voltage of the power source 1 is therefore introduced into the control semiconductor device 10B, on a connection line that connects the terminal T1 of the control semiconductor device 10A of FIG. 4 to the terminal T4. The voltage of the power source supplied to the driven semiconductor device 20 is thereby converted to the drive voltage of the driven semiconductor device 20 by the regulator 4.

As illustrated in FIG. 5, the regulator 4 includes, for example, resistors R1 and R2, an error amplifier AMP1, and a reference power source $V_{REF}$, and is supplied with the power source from the power source 1 connected to the terminal T1. Note that the internal circuit of the regulator 4 is not limited to the circuit illustrated as an example in FIG. 5, and, for example, a switching regulator may be employed. Herein, the reference power source $V_{REF}$ is set to the same voltage as the drive voltage of the driven semiconductor device 20.

The reference power source $V_{REF}$ is input to a non-inverting terminal of the regulator 4, and an output voltage of the regulator 4 is input to an inverting terminal of the regulator 4 as a feedback voltage. The regulator 4 thereby controls such that the error amplifier AMP1 continuously compares the feedback voltage of the regulator 4 against the voltage of the reference power source $V_{REF}$ and regulates the output voltage of the error amplifier AMP1, such that the difference becomes zero, such that the output voltage of the regulator 4 approaches the voltage of the reference power source $V_{REF}$, even in cases in which the output voltage of the regulator 4 fluctuates with voltage fluctuations in the power source 1.

However, current sufficient to drive the regulator 4 cannot be acquired from the power source 1 when the voltage of the power source supplied from the power source 1 is less than the operation-enabling voltage $V_B$ of the control semiconductor device 10B. Accordingly, the regulator 4 does not start up normally, and a case arises in which the output voltage of the regulator 4 is an unstable value and the driven semiconductor device 20 cannot start up in the standby state. Moreover, a case is conceivable in which the current from the power source 1 is consumed by the regulator 4, and current needed for the controller 2 to start up is no longer supplied to the controller 2.

Accordingly, a circuit that controls the current consumed by the regulator 4 must be added to the control semiconductor device 10B illustrated in the example of FIG. 5.

Moreover, it is conceivable that a voltage larger than the drive voltage of the driven semiconductor device 20 may be momentarily output from the regulator 4 when the output voltage of the regulator 4 becomes an unstable value, depending on the situation. A circuit that suppresses the voltage of the regulator 4 to the withstand voltage of the driven semiconductor device 20 or lower during the startup time therefore needs to be added to the control semiconductor device 10B illustrated in the example of FIG. 5.

In some cases, such a circuit that suppresses the voltage of the regulator 4 during the startup time to the withstand voltage of the driven semiconductor device 20 or lower, and a circuit that suppresses the current consumed by the regulator 4, become complicated circuits, increasing the cost of the control semiconductor device 10B, and increasing the scale of the control semiconductor device 10B compared to the scale of the control semiconductor device 10B before addition of these circuits.

Accordingly, explanation follows regarding a semiconductor device capable of using a voltage drop across a diode to start up a control semiconductor device and a driven semiconductor device in the standby state using a simpler circuit, in a situation in which the control semiconductor device and the driven semiconductor device have different drive voltages, even in a state in which the only voltage supplied from the power source 1 is less than the operation-enabling voltage $V_B$ of the control semiconductor device.

FIG. 1 is a circuit diagram illustrating an example of a control semiconductor device 10 and a driven semiconductor device 20 according to the exemplary embodiment.

The circuit diagram of the control semiconductor device 10 illustrated in the example of FIG. 1 differs from the circuit diagram of the control semiconductor device 10B illustrated in the example of FIG. 5 in that diodes D1 and D2 are connected between a point P on a connection line that connects the terminal T1 and a power source terminal of the regulator 4 together, and a point Q on a connection line that connects a power source terminal of the output section 3 and the terminal T4 together, in that a switch SW1 connects the output of the regulator 4 to a point U on a connection line that connects the power source terminal of the output section 3 to the terminal T4, and in that a control circuit power source 5 is connected to a connection line that connects the terminal T1 to a control circuit 2A. Note that, in an aspect of the present invention, the terminal T1 is an example of an input terminal, the regulator 4 is an example of a power source section, the diode D1 and the diode D2 are examples of a voltage regulator, and the terminal T4 is an example of a power source supply terminal.

Although the two diodes D1 and D2, connected in series between the point P and the point Q, are introduced into the control semiconductor device 10 illustrated in FIG. 1, this number of introduced diodes is merely an example. Herein, the number of diodes introduced is preferably set such that the total of the voltage drop amount produced by the diodes when a forward bias is applied to the diodes approaches the difference between the drive voltages of the control semiconductor device 10 and the driven semiconductor device 20.

For example, when the drive voltage of the control semiconductor device 10 is 3V, the drive voltage of the driven semiconductor device 20 is 2V, and the voltage drop across one diode is 0.5V, two diodes are introduced connected in series between the point P and the point Q. Setting the number diodes in this manner causes the voltage supplied from the power source 1 to be lowered down to the drive voltage of the driven semiconductor device 20 by the diodes D1 and D2, even when the drive voltage of the control semiconductor device 10 is, for example, supplied from the power source 1, and this voltage is supplied to the output section 3 and the terminal T4. The standby signal output from the control semiconductor device 10 to the driven semiconductor device 20, and the voltage of the power source, can accordingly be restricted to being the drive voltage of the driven semiconductor device 20 or less.

Note that, other than the number of diodes, the voltage drop caused by the diodes may be adjusted by changing the type of diode.

Moreover, content of the controller 2 is described in detail in FIG. 1, and it is indicated that the control circuit 2A and a reset circuit 2B are included in the controller 2.

The control circuit 2A and the reset circuit 2B are connected together within the controller 2, and exchange signals, data, and the like with each other. Moreover, the reset circuit 2B is connected to the output section 3 and the switch SW1. The control circuit 2A is connected to the terminal T2, and outputs the control signal to the driven semiconductor device 20 through the terminals T2 and T5.

The power source is thereby supplied from the control circuit power source 5 to the control circuit 2A. Moreover, the reset circuit 2B is connected to the terminal T1, and the power source is supplied to the reset circuit 2B from the power source 1, and not from the control circuit power source 5. Note that the control circuit power source 5 may be included in the control circuit 2A.

Next, explanation follows regarding operation of the control semiconductor device 10. The control semiconductor device 10 executes plural operations according to the output voltage of the power source 1.

Figure 2:
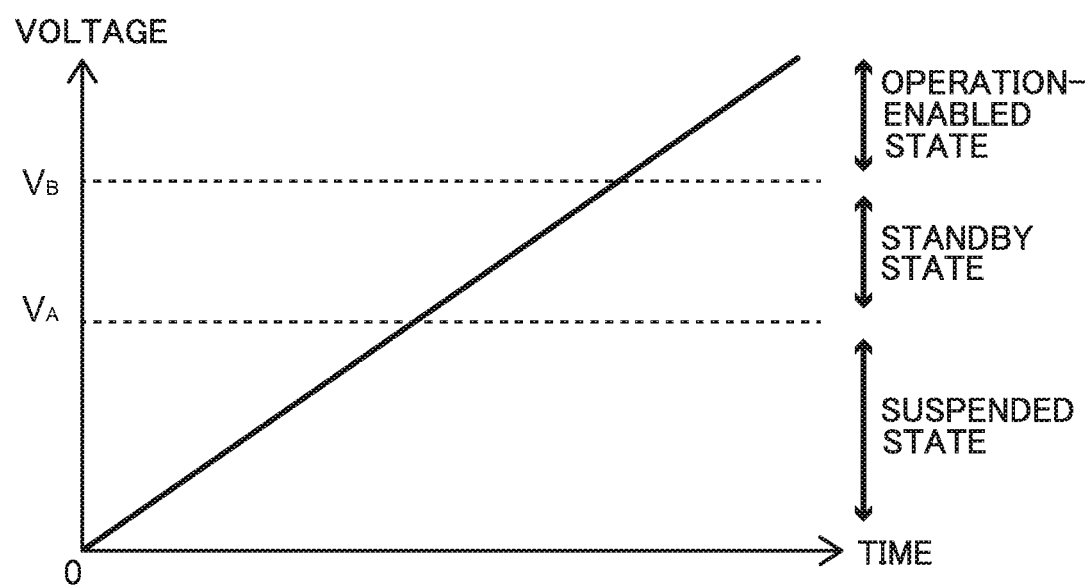
FIG. 2 is a graph illustrating an example of an output voltage of a solar panel.

FIG. 2 is a graph illustrating an example of variation in the output voltage of the power source 1. The power source 1 uses a solar panel to output a voltage, and the output voltage therefore fluctuates according to the intensity of the sunlight radiated onto the solar panel. The graph of the output voltage of the power source 1 illustrated in the example of FIG. 2 illustrates a condition in which the initial output voltage is, for example, 0V in bad weather, but then the output voltage increases as the weather gradually improves with time. For convenience of explanation, FIG. 2 illustrates a graph in which the output voltage of the power source 1 is proportional to time; however, a graph illustrating the output voltage of the power source 1 will often curve as the time changes in practice.

The reset circuit 2B monitors variation of the voltage of the power source 1 supplied from the terminal T1, and executes prescribed startup processing for the control semiconductor device 10 for respective voltage values of the power source 1 by comparing against plural predetermined threshold voltage values. The plural threshold voltage values include, for example, the operation-enabling voltage $V_B$, and a standby-enabled voltage $V_A$ that is set to a lower voltage than the operation-enabling voltage $V_B$.

In such a case, the standby-enabled voltage $V_A$ is preferably set to a voltage corresponding to the total of the voltage drop amount of the diodes D1 and D2. Moreover, the controller 2 is configured capable of starting up in the standby state when supplied with a power source of the standby-enabled voltage $V_A$ or more, and the controller 2 is set such that control of the driven semiconductor device 20 can be executed when supplied with a power source equal to the operation-enabling voltage $V_B$ or more.

Accordingly, a state in which the voltage of the power source 1 is less than the standby-enabled voltage $V_A$ is denoted a "suspended state", a state in which the voltage of the power source 1 is equal to or more than the standby-enabled voltage $V_A$ but less than the operation-enabling voltage $V_B$ is denoted a "standby state", and a state in which the voltage of the power source 1 is the operation-enabling voltage $V_B$ or more is denoted an "operation-enabled state".

First, explanation follows regarding operation of the control semiconductor device 10 in the suspended state.

In this case, as already explained, the reset circuit 2B is unable to start up and adopts a state in which operation is suspended, and the control circuit 2A also is unable to start up and adopts a state in which operation is suspended.

The switch SW1 is preset so as to be OFF when the voltage of the power source 1 is less than the standby-enabled voltage $V_A$, and output of the regulator 4 therefore adopts a high impedance state and a state is adopted in which the regulator 4 and the terminal T4 are disconnected from each other.

A forward bias is supplied to the diodes D1 and D2 from the power source 1. However, due to the voltage drop produced by the diodes D1 and D2, the voltage of the power source 1 is not supplied to the driven semiconductor device 20 from the terminal T4, and the driven semiconductor device 20 also cannot operate and adopts a suspended state.

Next, explanation follows regarding operation of the control semiconductor device 10 in the standby state.

In this case, operation of the reset circuit 2B starts, the reset circuit 2B outputs the standby signal to the output section 3, and also outputs the standby signal to the control circuit 2A. When the control circuit 2A receives the standby signal from the reset circuit 2B, the control circuit 2A adopts the standby state, and stands by such that execution of control of the driven semiconductor device 20 cannot execute until the standby signal is suspended by the reset circuit 2B.

Moreover, the reset circuit 2B outputs a switch state control signal to the switch SW1 instructing the switch SW1 to switch OFF, and thus controls the switch SW1. Note that the switch SW1 continues to be in the OFF state since the switch SW1 is also OFF in the suspended state.

However, a voltage decreased by the voltage drop amount of the diodes D1 and D2 is supplied to the terminal T4 and the output section 3 from the power source 1. Accordingly, when the output section 3 receives the standby signal from the reset circuit 2B, the output section 3 outputs, to the driven semiconductor device 20 from the terminal T3, the standby signal including the voltage value of the power source supplied to the output section 3. Note that the terminal T3 is an example of an output terminal in an aspect of the present invention.

The voltage from the power source 1, lowered by the voltage drop amount of the diodes D1 and D2, is supplied from the terminal T4 of the control semiconductor device 10 through the terminal T7 to the driven semiconductor device 20, and the standby signal is input to the driven semiconductor device 20 from the terminal T3 of the control semiconductor device 10 through the terminal T6. The driven semiconductor device 20 accordingly transitions to the standby state, and stands by such that operation of the driven semiconductor device 20 does not execute until the standby signal from the control semiconductor device 10 has been suspended.

Next, explanation follows regarding operation of the control semiconductor device 10 in the operation-enabled state.

In this case, the reset circuit 2B suspends the standby signal being output to the output section 3, and also suspends the standby signal being output to the control circuit 2A. The control circuit 2A stops receiving the standby signal from the reset circuit 2B and adopts the operation-enabled state. The control circuit 2A then outputs the control signal to the driven semiconductor device 20 through terminal T2, and executes predetermined control on the driven semiconductor device 20.

Moreover, the reset circuit 2B, for example, reads a set state of strap pin included in the reset circuit 2B, and outputs a switching state control signal that instructs the switch SW1 to switch ON in cases in which the strap pin is shorted. Otherwise, when the strap pin is open, namely, when a high impedance state is set, the reset circuit 2B outputs a switching state control signal instructing the switch SW1 to continue to be OFF.

Thus, the reset circuit 2B controls the ON/OFF state of the switch SW1 after release of the standby state of the control semiconductor device 10, according to user instruction. Note that the method by which the user controls and instructs the switch SW1 is not limited, and it goes without saying that another method such as reading a register value, or setting a strap pin, may also be employed. Explanation is given here regarding an example in which an instruction to set the switch SW1 to ON is issued from a user. In cases in which an instruction to set the switch SW1 to OFF is being issued from the user, the switch SW1 is set to ON after waiting for an instruction to set the switch SW1 to ON to be issued from the user.

Thus, the power source set by the drive voltage of the driven semiconductor device 20 is supplied to the terminal T4 and the output section 3 from the regulator 4, since the switch SW1 is switched ON by the reset circuit 2B.

Moreover, accompanying suspension of the standby signal from the reset circuit 2B, the output section 3 suspends the standby signal being output to the driven semiconductor device 20.

Namely, the standby signal that was being input from the control semiconductor device 10 is suspended as the drive voltage of the driven semiconductor device 20 is supplied from the terminal T4 of the control semiconductor device 10 to the driven semiconductor device 20 through the terminal T7. Accordingly, the driven semiconductor device 20 transitions from the standby state to the operation-enabled state, and driving starts according to the control signal input from the control semiconductor device 10 through the terminal T5.

Although the diodes D1 and D2 illustrated in FIG. 1 are used to lower the voltage of the power source 1 down to the drive voltage of the driven semiconductor device 20, a method of lowering the voltage of the power source 1 other than with diodes may be employed.

Figure 3:
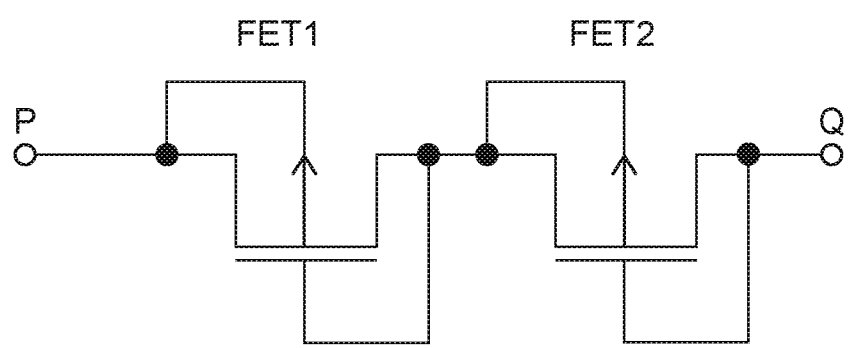
FIG. 3 is a circuit diagram illustrating an example of a case in which voltage is lowered using a FET.

FIG. 3 is a circuit diagram illustrating an example of a voltage drop when a field effect transistor (FET) is employed. As illustrated in FIG. 3, for example, as well as the gates of a P-type FET1 and a P-type FET2 being grounded, a drain terminal of the FET1 and a source terminal of the FET2 are connected together, and a source terminal of the FET1 is connected to a point P, and a drain terminal of the FET2 is connected to a point Q. In this case also, the voltage of the power source 1 is dropped by the amount of voltage drop produced by the FET1 and the FET2.

In addition, various other examples of voltage drops are conceivable, such as a method that employs a resistor, a method that employs a diode and a resistor in combination, or a method that employs a FET and a resistor in combination. However, when a resistor is employed, current is consumed even when the control semiconductor device 10 is in a suspended state, such that there is a possibility that the standby state could not be transitioned to despite the voltage of the power source 1 being the standby-enabled voltage $V_A$ or more. Accordingly, it is conceivable that another circuit element would be needed in addition to the resistor.

However, diodes are easier to manufacture than other components such as resistors or FETs, and the voltage can be lowered even when the control semiconductor device 10 is in a suspended state and in a state in which there is no control performed by the controller 2. Accordingly, diodes are preferably employed as the method of lowering the voltage of the power source 1 in the suspended state and the standby state.

Moreover, in the control semiconductor device 10 illustrated in FIG. 1, the power source is supplied to the control circuit 2A from the control circuit power source 5, and the power source is supplied to the reset circuit 2B from the power source 1.

Components that require a more stable power source than the reset circuit 2B, such as a central processing unit (CPU) and memory, are included in the control circuit 2A. Accordingly, rather than the power source of the power source 1 being directly supplied to the control circuit 2A, the power source is supplied to the control circuit 2A with, for example, voltage fluctuations of the power source 1 suppressed by the control circuit power source 5.

However, when the control semiconductor device 10 is in the suspended state or the standby state, it is conceivable that the control circuit power source 5 will not receive the supply of power needed for the control circuit power source 5 to operate normally from the power source 1, and the output of the control circuit power source 5 will become unstable. In such cases, it is difficult for control to be performed by the reset circuit 2B in each of the states described above.

Accordingly, directly supplying the power source of the power source 1 to the reset circuit 2B enables the reset circuit 2B to compare the output voltage of the power source 1 against the operation-enabling voltage $V_B$ and the standby-enabled voltage $V_A$, and enables control to be executed in each state according to the voltage of the power source 1.

According to the present exemplary embodiment, when the control semiconductor device 10 is in the suspended state or the standby state, the switch SW1 is switched OFF, and a power source obtained by lowering the voltage of the power source 1 to the drive voltage of the driven semiconductor device 20 using the diodes D1 and D2 is supplied to the driven semiconductor device 20 rather than the power source from the regulator 4. Accordingly, when the control semiconductor device 10 is in the suspended state or the standby state, the consumed current of the regulator 4 can be suppressed, and a startup time voltage from the regulator 4 that exceeds the drive voltage of the driven semiconductor device 20 can be prevented from being momentarily supplied to the driven semiconductor device 20.

Namely, the control semiconductor device 10 does not include a complicated circuit configuration, and the control semiconductor device 10 and the driven semiconductor device 20, which have different drive voltages, can start up.

Although explanation has been given using the present exemplary embodiment, the technical scope of the present invention is not limited to the scope of the exemplary embodiment described above. Numerous modifications or improvements may be made to the exemplary embodiment above within a range that does not depart from the spirit of the invention, and embodiments to which these modifications or improvements have been made are also included within the technical scope of the invention.

What is claimed is:

1. A semiconductor device comprising:
an input terminal to which a voltage from a solar cell is supplied;
a power source section that generates, based on the voltage supplied at the input terminal, an output voltage lower than the voltage supplied by the input terminal;
a power source supply terminal that outputs the output voltage to an external device;
a control terminal that is connected to the external device and that outputs a control signal that drives the external device;
a controller that controls a timing at which the control signal is output to the external device via the control terminal;
at least one diode to which the input terminal supplies power, and which is configured to drop the voltage supplied at the input terminal and supply the dropped voltage to the power source supply terminal, the at least one diode and the power source section being connected in parallel between the input terminal and the power source supply terminal;
a switch that is disposed on a line that connects the power source section and the power source supply terminal and that controls a connection between the power source section and the power source supply terminal, the switch being configured to control the output voltage output by the power source supply terminal to switch between the dropped voltage that is output from the at least one diode and the output voltage supplied by the power source section; and
an output terminal that is connected to the external device, and that outputs a standby signal instructing the external device to prepare for driving,
wherein the controller generates the standby signal and controls a timing at which the standby signal is output from the output terminal.

2. The semiconductor device of claim 1, wherein the controller outputs, to the switch, a switch state control signal that switches the switch ON or OFF, according to a voltage value of the power supplied from the input terminal, and controls an ON/OFF state of the switch.

3. A semiconductor device comprising:
an input terminal to which a voltage from a solar cell is supplied;
a power source section that generates, based on the voltage supplied by the input terminal, an output voltage lower than the voltage supplied by the input terminal;
a power source supply terminal that outputs the output voltage to an external device;
a switch that controls a connection between the power source section and the power source supply terminal;
a voltage regulator to which the input terminal supplies power, and that supplies a voltage to the power source supply terminal;
an output terminal that is connected to the external device, and that outputs a standby signal instructing the external device to prepare for driving; and
a controller that generates the standby signal, and that controls a timing at which the standby signal is output from the output terminal,
wherein the controller is connected to the output terminal through an output section to which power from either the power source section or the voltage regulator is supplied, according to a voltage value of the power supplied from the input terminal, and
wherein the output section outputs, to the output terminal, the standby signal that has been input from the controller.

4. A semiconductor device comprising:
an input terminal to which a voltage from a solar cell is supplied;
a power source section that generates, based on the voltage supplied by the input terminal, an output voltage lower than the voltage supplied by the input terminal;
a power source supply terminal that outputs the output voltage to an external device;
a switch that controls a connection between the power source section and the power source supply terminal;
a voltage regulator to which the input terminal supplies power, and that supplies a voltage to the power source supply terminal;
an output terminal that is connected to the external device, and that outputs a standby signal instructing the external device to prepare for driving; and
a controller that generates the standby signal, and that controls a timing at which the standby signal is output from the output terminal,
wherein the controller outputs, to the switch, a switch state control signal that switches the switch ON or OFF, according to a voltage value of the power supplied from the input terminal, and controls an ON/OFF state of the switch, and
wherein the controller comprises a reset circuit that outputs the standby signal and the switch state control signal, and a control circuit that transitions internal operation to a control preparation state, due to the standby signal from the reset circuit.

5. The semiconductor device of claim 4, wherein the power from the input terminal is supplied to the reset circuit; and
power is supplied to the control circuit through a control circuit power source section to which the power from the input terminal is supplied.

6. The semiconductor device of claim 5, wherein
when a voltage value of the power supplied to the reset circuit from the input terminal is less than a first threshold value, operation of the control circuit and the reset circuit is suspended in a state in which the switch is OFF;
when the voltage value of the power supplied to the reset circuit from the input terminal is equal to or greater than the first threshold value but is less than a second threshold value greater than the first threshold value, the reset circuit outputs the standby signal to the external device via an output section and to the control circuit, outputs the switch state control signal to the switch, and controls the switch such that the switch is OFF; and
when the voltage value of the power supplied to the reset circuit from the input terminal is equal to or greater than the second threshold value, the reset circuit suspends the standby signal being output to the output section and the control circuit, outputs the switch state control signal to the switch, and controls the switch such that the switch is in a predetermined ON or OFF state.

7. A semiconductor device comprising:
an input terminal to which a voltage from a solar cell is supplied;

a power source section that generates, based on the voltage supplied by the input terminal, an output voltage lower than the voltage supplied by the input terminal;

a power source supply terminal that outputs the output voltage to an external device;

a control terminal that is connected to the external device and that outputs a control signal that drives the external device;

a switch that controls a connection between the power source section and the power source supply terminal;

a voltage regulator to which the input terminal supplies power, and that supplies a voltage to the power source supply terminal;

an output terminal that is connected to the external device, and that outputs a standby signal instructing the external device to prepare for driving; and a controller that generates the standby signal, and that controls a timing at which the standby signal is output from the output terminal, wherein the controller generates the control signal to drive the external device via the control terminal, and a state of the controller is switchable between a standby mode in which the controller is in a standby state and a driving mode in which the controller drives the external device.

8. The semiconductor device of claim 7, wherein the voltage regulator comprises a diode.

* * * * *